United States Patent
Hartswick

(10) Patent No.: US 6,274,393 B1
(45) Date of Patent: *Aug. 14, 2001

(54) METHOD FOR MEASURING SUBMICRON IMAGES

(75) Inventor: Thomas J. Hartswick, Underhill, VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/062,967

(22) Filed: Apr. 20, 1998

(51) Int. Cl.[7] ................................................. H01L 21/66
(52) U.S. Cl. ........................... 438/14; 438/462; 438/712; 438/735; 438/975; 438/719
(58) Field of Search ................................. 216/66, 49, 51; 438/14, 462, 712, 735, 719, 975, 725

(56) References Cited

U.S. PATENT DOCUMENTS

| | | | |
|---|---|---|---|
| 4,275,286 | * | 6/1981 | Hackett, Jr. .......................... 216/66 |
| 4,447,291 | | 5/1984 | Schulte . |
| 4,502,916 | * | 3/1985 | Umezaki et al. ...................... 216/47 |
| 5,246,539 | * | 9/1993 | Canestrari et al. ..................... 216/2 |
| 5,417,799 | * | 5/1995 | Daley et al. .......................... 216/24 |
| 5,493,116 | | 2/1996 | Toro-Lira et al. . |
| 5,525,840 | * | 6/1996 | Tominaga ............................ 257/797 |
| 5,591,675 | | 1/1997 | Kim et al. . |
| 5,711,848 | * | 1/1998 | Iturralde ............................... 438/14 |

\* cited by examiner

Primary Examiner—Ngoc-Yen Nguyen
(74) Attorney, Agent, or Firm—Scully, Scott, Murphy & Presser; James M. Leas

(57) ABSTRACT

A method for determining the quality of features of a photoresist pattern, especially for vias and contacts, formed on a semiconductor wafer. A photoresist mask layer having a pattern of openings therein is deposited onto the wafer, and a test region (kerf) of the wafer is marked through the openings in the mask layer. In a preferred embodiment, the mask layer is a photoresist layer, although in alternative embodiments the mask layer could be provided as an insulator mask layer or a metal mask layer. The marking transfers an image of the bottom of the mask layer into the substrate by etching, such as by rastering a focused ion beam over the openings in the mask layer in the presence of an etchant gas. This provides an etched mark in the wafer defined by the passage of the focused ion beam through the mask opening. In alternative embodiments, the marking could be performed by staining or dyeing. Following the marking step, the mask layer is removed from the test region to facilitate an inspection of the wafer for the presence of the marking while leaving the mask layer in place over remaining portions of the wafer.

15 Claims, 2 Drawing Sheets

METHOD FOR MEASURING SUBMICRON IMAGES

BACKGROUND OF THE INVENTION

1. Technical Field

The present invention relates generally to a method for measuring submicron images which are currently not measurable or resolvable by any known prior art technique.

As semiconductor features continue to shrink and the subtleties of pattern densities become apparent (e.g. photoresist thickness variations across a chip), the ability to determine the quality of the photoresist features, especially for vias and contacts, becomes increasingly difficult. Is the image open at the bottom? What is the size of the image at the bottom? These are the important questions which are answered by the present invention. As semiconductor images shrink to the sub-micron regime, the ability to determine masking image quality becomes increasingly difficult.

2. Prior Art

Photoresist patterns on semiconductor wafers are typically about 1.0 micron thick. As horizontal images drop below 0.5 microns, this creates a submicron aspect ratio of 2:1 or higher. An important factor in the success of transferring the photoresist image into the semiconductor lies in the ability to determine the image size at the interface between the photoresist and the semiconductor (the "bottom" of the photoresist image).

Currently, low voltage scanning electron microscopes (SEMS) are used to measure these images. Unfortunately, submicron high aspect ratio images in the photoresist pattern create structures which do not allow repeatable accurate measurements using this technique.

Standard practice includes running a wafer through an etch step and a resist removal step, and then measuring the resulting etched image. Downsides of this procedure include 1) the time lost while the wafer is processed, 2) if the images are out of specification the wafer must be discarded, and 3) it does not accurately determine if the photoresist image is completely open.

An alternative method is disclosed in Tiro-Lira et al. U.S. Pat. No. 5,493,116 wherein an SEM is modified to include two detectors which work in conjunction to provide an improved depth of field using backscatter emission. Although this technique may work with 0.5 micron images in 2 micron thick resist (as described in the patent), as images reduce even further this technique may soon become too limited.

SUMMARY OF THE INVENTION

Accordingly, it is a primary object of the present invention to provide a method for measuring submicron (below one micron) images.

A further object of the subject invention is the provision of a method which qualitatively indicates whether an image is "open" at the bottom thereof, as well as a structure which allows accurate measurements of currently unresolvable images.

The present invention provides several advantages relative to the standard prior art practice of running a wafer through an etch step and a resist removal step, and then measuring the resulting etched image. The present invention provides advantages of eliminating time lost while a defective wafer is processed, eliminating the waste of discarded wafers if the images are out of specification, and also accurately determines if the photoresist image is completely open.

In accordance with the teachings herein, the present invention provides a method of processing a semiconductor wafer for measuring submicron images thereon. A mask layer having openings therein is deposited onto the wafer, and a test region of the wafer is marked through the openings in the mask layer. The test region is subsequently inspected to detect for the presence of the markings thereon.

In a preferred embodiment, the mask layer is a photoresist layer, although in alternative embodiments the mask layer could be provided as an insulator mask layer or a metal mask layer.

In a preferred embodiment, the marking transfers an image of the bottom of the mask layer into the substrate by etching, such as by rastering a focused ion beam over openings in the mask layer in the presence of an etchant gas in a nonactive region (kerf) of the wafer. This method provides an etched mark in the wafer defined by the passage of the focused ion beam through the mask opening. The etchant is chosen to provide high selectivity between the substrate material and the mask material, thus perturbing the mask material as little as possible. In alternative embodiments, the marking could be performed by transferring an image of the bottom of the mask layer into the substrate by staining or dyeing.

The marking preferably comprises a directional marking, such as provided by the focused ion beam, to provide a measurement of the size of the opening in the mask layer. The marking is preferably performed in a region of the wafer which is not otherwise used to form active a circuit chips in the wafer, and also is preferably performed in several different test areas of the wafer.

In a preferred embodiment, following the marking step, the mask layer is removed from the test region to facilitate inspection of the wafer while leaving the mask layer in place over remaining portions of the wafer. The mask layer can be removed from the test region by a focused ion beam or by laser ablating, to facilitate a measurement of the dimensions of the transferred image. In one disclosed embodiment, the mask layer is removed by a focused ion beam in the presence of water vapor to enhance removal of the photoresist.

In one disclosed embodiment, a Focused Ion Beam (FIB) in the presence of an etchant gas such as Br/XeF2, is rastered over a submicron image in the kerf, to transfer an image of the bottom of the photoresist pattern into a silicon wafer substrate. Subsequent ablation of the photoresist in the rastered area facilitates a measurement of the transferred image. This inspection process can be performed on a product without sacrificing the wafer. Alternative methods of marking the wafer include staining or dyeing, for example adding a stain to the developing solution. Whatever method is selected, the marking transferred to the wafer must be unaffected by the subsequent process of removing the photoresist.

The present invention provides a novel physical transference of an image of the bottom of the photoresist pattern by an etchant technique or by dyeing or staining, such that the transferred image can be subsequently seen in a particle beam (FIB, SEM, etc). A localized area of the photoresist pattern may need to be removed (as by FIB, laser ablation, etc.) in order to provide for the subsequent inspection/measurement step.

The present invention provides a method for inspecting a photoresist pattern on a semiconductor wafer which comprises providing a photoresist mask layer on a wafer having images therein, marking at least one test region of the wafer through the photoresist mask layer in a portion of the wafer which is not otherwise used in a circuit formed in the semiconductor wafer, then removing the mask layer from the test region while leaving the mask layer in place over remaining portions of the wafer, and inspecting the test region to determine whether the wafer was actually marked to ensure that the photoresist mask images are properly formed and open to the bottoms thereof.

In greater detail, the mask layer can be a photoresist, and the images can include contacts. The etching step can be performed in a FIB tool. The mask can be removed with ions in the presence of water to enhance the removal of photoresist with respect to other layers. The etch detecting step measures the image transferred to ensure that the mask layer is properly opened.

BRIEF DESCRIPTION OF THE DRAWINGS

The foregoing objects and advantages of the present invention for a method for measuring submicron images may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
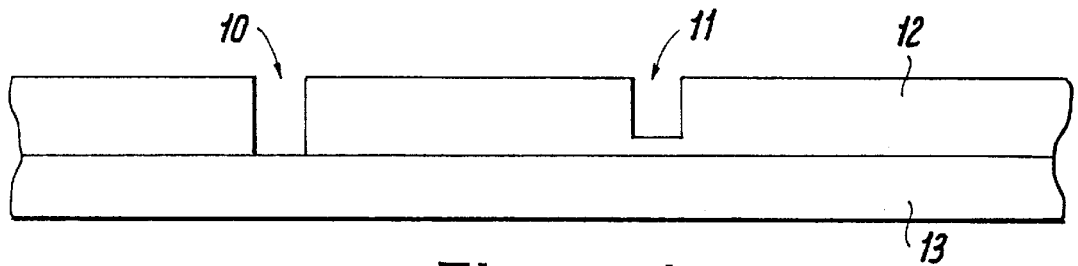
FIG. 1 shows a graphical representation of an open image as well as an unopen image at the bottom of a mask structure positioned on a thin film.

As semiconductor images decrease in size, it becomes inherently more difficult to determine whether an image is open or not at the bottom thereof. It also becomes more difficult to accurately assess the image size at the bottom of the mask structure. FIG. 1 shows a graphical representation of an "open" image 10 as well as an "unopen" image 11 at the bottom of a mask structure 12 positioned on a thin film 13.

Figure 1A:
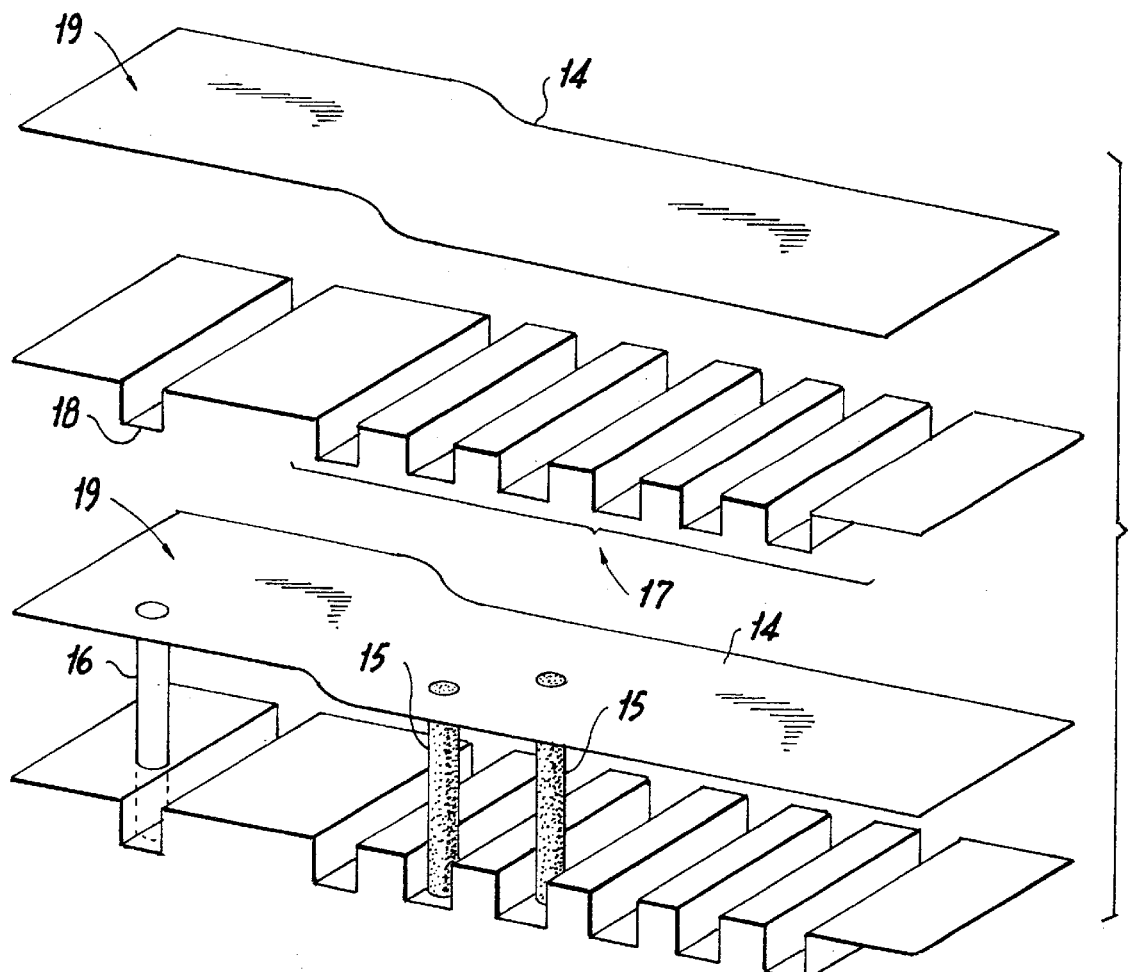
FIG. 1A is a more realistic portrayal of a photoresist mask, wherein the lower portion thereof illustrates two vias which are properly open down to the substrate, and a third via which is not properly open down to the substrate.

FIG. 1A is a more realistic portrayal of a photoresist mask 14 wherein the lower portion thereof illustrates two vias 15 which are properly open down to the substrate and a third via 16 which is not properly open down to the substrate.

FIG. 1A also illustrates a nested group of troughs 17 on the right side thereof and an isolated trough 18 on the left side thereof. FIG. 1A also shows how the mask 14 dips down as it is deposited over the nested group of troughs 17. The thicker photoresist mask layer 19 over the isolated trough 18 presents a worst case or probability of an unopened image at the bottom of the mask, which is illustrated in the bottom of FIG. 1A by the unopened via 16. Variations in image quality can also be caused by a nested group of vias, as opposed to an isolated via. A test area could be designed in the kerf to simulate the worst case features within the active area of the chip.

Figure 2:
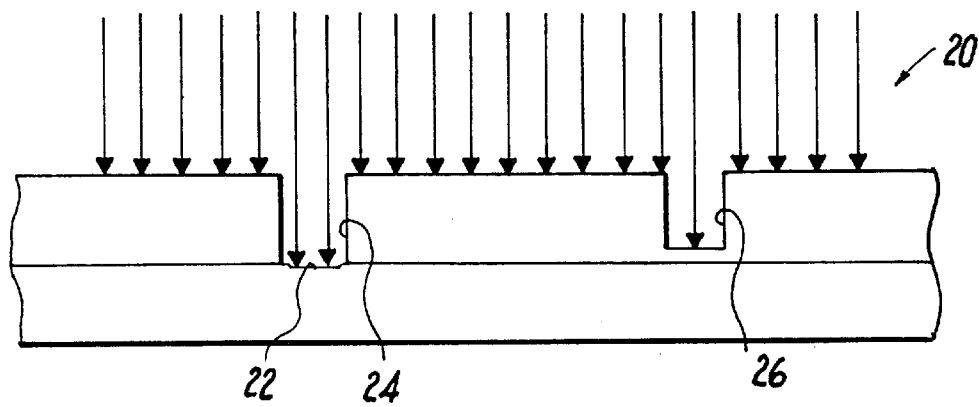
FIG. 2 illustrates applying a marking technique to a localized area of the semiconductor wafer and the structure at the bottom of the mask image which is then transferred into the thin film as a marked area.
Figure 3:
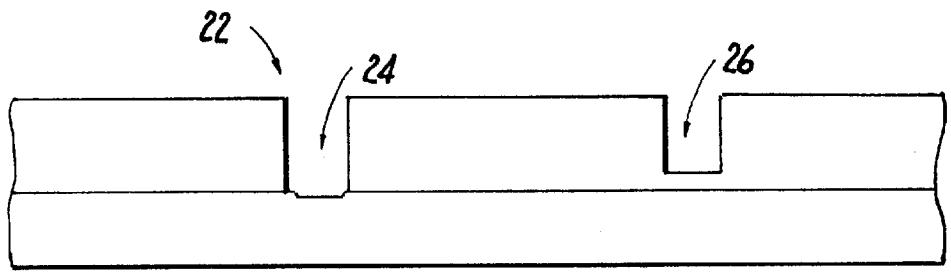
FIG. 3 shows the marked area in the thin film.

FIG. 2 illustrates applying a "marking" to a localized area 20 of the semiconductor wafer, and the marked area 22 at the bottom of the mask image which is transferred into the thin film without affecting the entire surface. An open area 24 of the photoresist pattern successfully transfers a marking 22, while an unopen area 26 of the photoresist pattern does not successfully transfer a marking. The localized test region 20 of the mask layer is preferably in a kerf region of the wafer which is not otherwise used in a circuit formed in the semiconductor wafer. In actual practice, the semiconductor wafer is preferably tested in several different test areas 20 to provide a more comprehensive inspection of the wafer.

FIB is a preferred marking technique, but staining, dyeing, painting, etc. may be employed in alternative embodiments. In one embodiment, the marking step uses a focused ion gallium beam in bromine gas to lightly bromine mill an image of the bottom edge of the photoresist pattern into the substrate, with this processing being performed in the kerf area of the semiconductor wafer.

Figure 4:
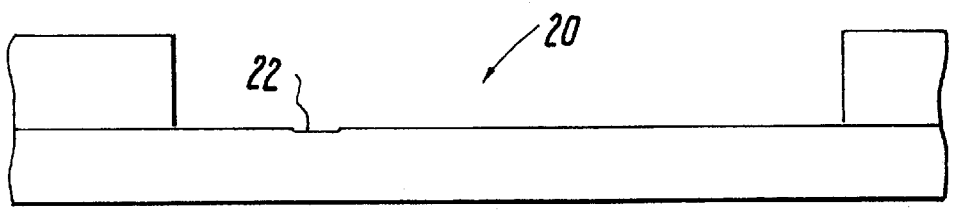
FIG. 4 shows the area after the mask has been removed in the localized area, to facilitate an accurate measurement of the dimension of the marked area.

FIG. 4 shows the area after the photoresist mask has been removed in the localized area 20. FIB is a preferred mask removal technique. However, an alternative embodiment could employ laser ablation as a mask removal technique. The photoresist is either laser ablated or treated with an FIB to facilitate an inspection of the wafer to determine if the wafer was actually marked or etched, to determine that the vias and contacts defined by the photoresist pattern were actually fully open to the bottom of the pattern.

Figure 5:
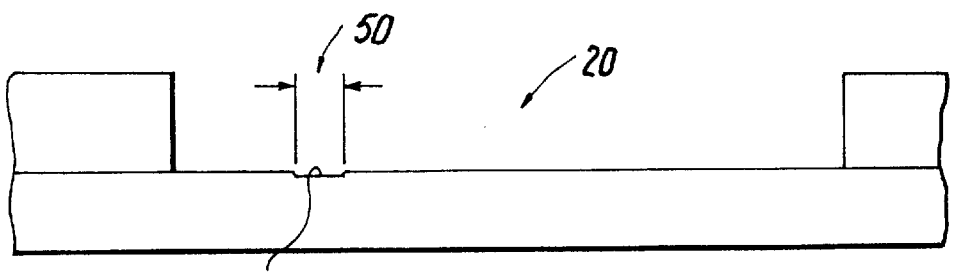
FIG. 5 shows the measurement of the originally transferred image.

FIG. 5 shows the measurement 50 of the originally transferred image. This can be performed in the FIB tool also.

If the tests indicate a passed wafer, then the wafer is processed as a whole in a usual manner. An FIB tool can be used on the production line, with either a normal inspection wafer or a product wafer. Water vapor can be introduced into the FIB tool to assist in removing the photoresist only, and thus avoid the use of a laser.

In a preferred embodiment, a semiconductor wafer with a photoresist pattern applied thereto is placed in a Focused Ion Beam (FIB) apparatus. The sample is moved such that a test area or structure between the active chips (the kerf) is placed under the beam. An "etch" window is defined over the test structure which is significantly larger than the photoresist image, and an appropriate etchant chemistry is used. An appropriate etchant chemistry is one which etches the underlying thin film without affecting the masking material. In the case of a photoresist mask over SiO2, a XeF2 chemistry could be employed. This performs a slight etch to transfer the bottom of the resist image into the SiO2, as shown in FIG. 2. Then a new chemistry is employed which etches the photoresist away in the localized region of interest (water vapor is currently the chemistry of choice for etching photoresist), as shown in FIG. 4. The etched mark is then measured as shown in FIG. 5. If there is no mark, then the mask was not open at the bottom of the photoresist pattern.

While several embodiments and variations of the present invention for a method for measuring submicron images are described in detail herein, it should be apparent that the disclosure and teachings of the present invention will suggest many alternative designs to those skilled in the art.

What is claimed is:

1. A method of processing a wafer/mask combination, comprising the steps of:
   a. providing a wafer and a mask layer, with the mask layer positioned on the wafer, wherein the mask layer includes at least one submicron opening, located over a test area on the wafer that is not used to form active circuit areas on the wafer;

b. applying a marking technique to form a mark on the test area of the wafer through said opening in the mask layer;

c. removing only a portion of the mask layer from the wafer, said portion being over the test area of the wafer, while keeping the remainder of the mask layer on the wafer; and d. inspecting the test area of the wafer, while keeping said remainder of the mask layer on the wafer, for the presence of the mark to determine whether the opening extends completely through the mask layer.

2. A method of processing as claimed in claim 1, wherein the providing step provides a photoresist layer.

3. A method of processing as claimed in claim 1, wherein the providing step provides an insulator mask layer.

4. A method of processing as claimed in claim 1, wherein the providing step provides a metal mask layer.

5. A method of processing as claimed in claim 1, wherein the applying step includes the step of using an etching technique to transfer an image of a bottom of the test opening into the wafer.

6. A method of processing as claimed in claim 1, wherein the applying step includes the step of rastering a focused ion beam over the opening in the presence of an etchant gas to transfer an image of a bottom of the test opening into the wafer.

7. A method of processing as claimed in claim 6, wherein the rastering step provides an etched mark in the wafer in a kerf region of the wafer.

8. A method of processing a wafer as claimed in claim 1, wherein the applying step is performed by transferring an image of the bottom of the mask layer into the substrate by staining.

9. A method of processing a wafer as claimed in claim 1, wherein the applying step is performed by transferring an image of the bottom of the mask layer into the substrate by dyeing.

10. A method of processing as claimed in claim 1, wherein the applying step comprises a directional marking step to provide a measurement of the size of said test opening in the mask layer.

11. A method of processing as claimed in claim 1, wherein the removing step includes the step of removing the mask layer in the test area by laser ablating to allow a measurement of the mark.

12. A method of processing as claimed in claim 1, wherein the removing step includes the step of removing the mask layer in the test area by a focused ion beam to allow a measurement of the mark.

13. A method of processing as claimed in claim 12, wherein the mask layer is a photoresist, and the portion of the mask layer is removed by a focused ion beam in the presence of water vapor to enhance removal of the photoresist.

14. A method of processing as claimed in claim 1, wherein the inspecting step comprises measuring at least one dimension of said mark.

15. A method of processing as claimed in claim 1, wherein the wafer is marked and inspected in several different test areas.

* * * * *